US009041097B2

(12) United States Patent
Kusunoki

(10) Patent No.: US 9,041,097 B2
(45) Date of Patent: May 26, 2015

(54) SEMICONDUCTOR DEVICE

(71) Applicant: Shigeru Kusunoki, Tokyo (JP)

(72) Inventor: Shigeru Kusunoki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 18 days.

(21) Appl. No.: 13/849,344

(22) Filed: Mar. 22, 2013

(65) Prior Publication Data

US 2014/0077291 A1 Mar. 20, 2014

(30) Foreign Application Priority Data

Sep. 20, 2012 (JP) ................................. 2012-207393

(51) Int. Cl.
*H01L 29/66* (2006.01)
*H01L 29/16* (2006.01)
*H01L 29/423* (2006.01)
*H01L 29/739* (2006.01)
*H01L 29/49* (2006.01)

(52) U.S. Cl.
CPC ...... *H01L 29/66666* (2013.01); *H01L 29/1602* (2013.01); *H01L 29/1608* (2013.01); *H01L 29/4232* (2013.01); *H01L 29/7397* (2013.01); *H01L 29/4916* (2013.01)

(58) Field of Classification Search
CPC ............ H01L 29/1608; H01L 29/4232; H01L 29/4236; H01L 29/66704; H01L 29/7825
USPC .................. 257/145, 330, E21.409, E29.201, 257/E21.419; 438/133, 259, 270
See application file for complete search history.

(56) References Cited

U.S. PATENT DOCUMENTS

| 6,066,880 | A | 5/2000 | Kusunoki | |
|---|---|---|---|---|
| 2008/0290407 | A1* | 11/2008 | Kusunoki et al. | ............. 257/334 |
| 2010/0118455 | A1 | 5/2010 | Kusunoki | |
| 2011/0014763 | A1* | 1/2011 | Sreekantham et al. | ........ 438/270 |
| 2011/0207277 | A1* | 8/2011 | Loechelt et al. | ............. 438/270 |

(Continued)

FOREIGN PATENT DOCUMENTS

| JP | 07-147405 A | 6/1995 |
|---|---|---|
| JP | 07-176732 A | 7/1995 |
| JP | 08-078534 A | 3/1996 |

(Continued)

OTHER PUBLICATIONS

C. Lu et al.; "Anomalous C-V Characteristics of Implanted Poly MOS Structure in n+/p+ Dual-Gate CMOS Technology"; IEEE Electron Device Letters; vol. 10, No. 5; 1989; pp. 192-194.

*Primary Examiner* — Jarrett Stark
*Assistant Examiner* — Shahed Ahmed
(74) *Attorney, Agent, or Firm* — Studebaker & Brackett PC

(57) ABSTRACT

A semiconductor device includes a channel layer formed on a substrate, an insulating layer formed in contact with the channel layer, an impurity-doped first semiconductor layer formed on an opposite side of the insulating layer from the channel layer, an impurity-doped second semiconductor layer formed on an opposite side of the first semiconductor layer from the insulating layer, and a gate electrode formed on an opposite side of the second semiconductor layer from the first semiconductor layer. A quotient of an impurity density of the first semiconductor layer divided by a relative permittivity of the first semiconductor layer is greater than a quotient of an impurity density of the second semiconductor layer divided by a relative permittivity of the second semiconductor layer.

12 Claims, 12 Drawing Sheets

(56) References Cited

U.S. PATENT DOCUMENTS

2014/0138739 A1* 5/2014 Magri'et al. .................. 257/145
2014/0141585 A1* 5/2014 Nakamura et al. ............ 438/270

FOREIGN PATENT DOCUMENTS

| | | |
|---|---|---|
| JP | 11-068105 A | 3/1999 |
| JP | 2010-118548 A | 5/2010 |

* cited by examiner

SEMICONDUCTOR DEVICE

BACKGROUND OF THE INVENTION

1. Field of the Invention

The present invention relates to a semiconductor device used, e.g., for switching high currents.

2. Background Art

Japanese Laid-Open Patent Publication No. H08-078534 discloses a semiconductor device having a MOS structure. This semiconductor device has low impurity density polysilicon provided on its substrate with a gate insulating layer interposed therebetween. A metal silicide is provided on the polysilicon. That is, the semiconductor device has a gate electrode made up of the polysilicon and the metal silicide. The reason for the use of such low impurity density polysilicon is so that, when a gate voltage is applied to the gate, a depletion layer forms and extends in the polysilicon so as to reduce the voltage applied to the substrate.

Further, IEEE Electron Device letters EDL-10 (5) p192 (1989) "Anomalous CV characteristics of implanted poly MOS structure in n+/p+ dual-gate CMOS technology" discloses the fact that a depletion layer forms in gate electrodes.

When a semiconductor device is turned on by applying a voltage to its gate, the resulting saturation current of the semiconductor device must be between a predetermined allowable maximum saturation current and a predetermined allowable minimum saturation current. It should be noted that the gate voltage is bound to vary within a certain range. Therefore, the semiconductor device must be designed such that its saturation current is always between the allowable maximum saturation current and the allowable minimum saturation current even if the gate voltage varies over that range. That is, it is desirable to reduce the rate of change of the saturation current with respect to changes in the gate voltage.

In the case of the semiconductor device disclosed in the above Japanese Laid-Open Patent Publication, the rate of change of its saturation current with respect to its gate voltage is low, since a portion of the gate voltage is dropped across the polysilicon. This semiconductor device, however, is disadvantageous in that a thick (or long) depletion layer is always formed in the polysilicon when a voltage is applied to the gate, making it difficult to apply an adequate voltage to the gate insulating layer. To avoid this problem, for example the impurity density of the channel layer, in which an inversion layer is formed, may be reduced to reduce the threshold voltage. This, however, may result in latch-up.

SUMMARY OF THE INVENTION

The present invention has been made to solve the above problems. It is, therefore, an object of the present invention to provide a semiconductor device whose saturation current exhibits a reduced rate of change with respect to changes in the gate voltage without any problem.

The features and advantages of the present invention may be summarized as follows.

According to one aspect of the present invention, a semiconductor device includes a channel layer formed on a substrate, an insulating layer formed in contact with the channel layer, an impurity-doped first semiconductor layer formed on an opposite side of the insulating layer from the channel layer, an impurity-doped second semiconductor layer formed on an opposite side of the first semiconductor layer from the insulating layer, and a gate electrode formed on an opposite side of the second semiconductor layer from the first semiconductor layer. A quotient of an impurity density of the first semiconductor layer divided by a relative permittivity of the first semiconductor layer is greater than a quotient of an impurity density of the second semiconductor layer divided by a relative permittivity of the second semiconductor layer.

Other and further objects, features and advantages of the invention will appear more fully from the following description.

DETAILED DESCRIPTION OF THE PREFERRED EMBODIMENTS

Semiconductor devices in accordance with embodiments of the present invention will be described with reference to the accompanying drawings. Like reference symbols will be used to denote like or corresponding components, and their description may not be repeated. It should be noted that in the following description the term "impurity density" refers to the mean effective impurity density.

First Embodiment

Figure 1:
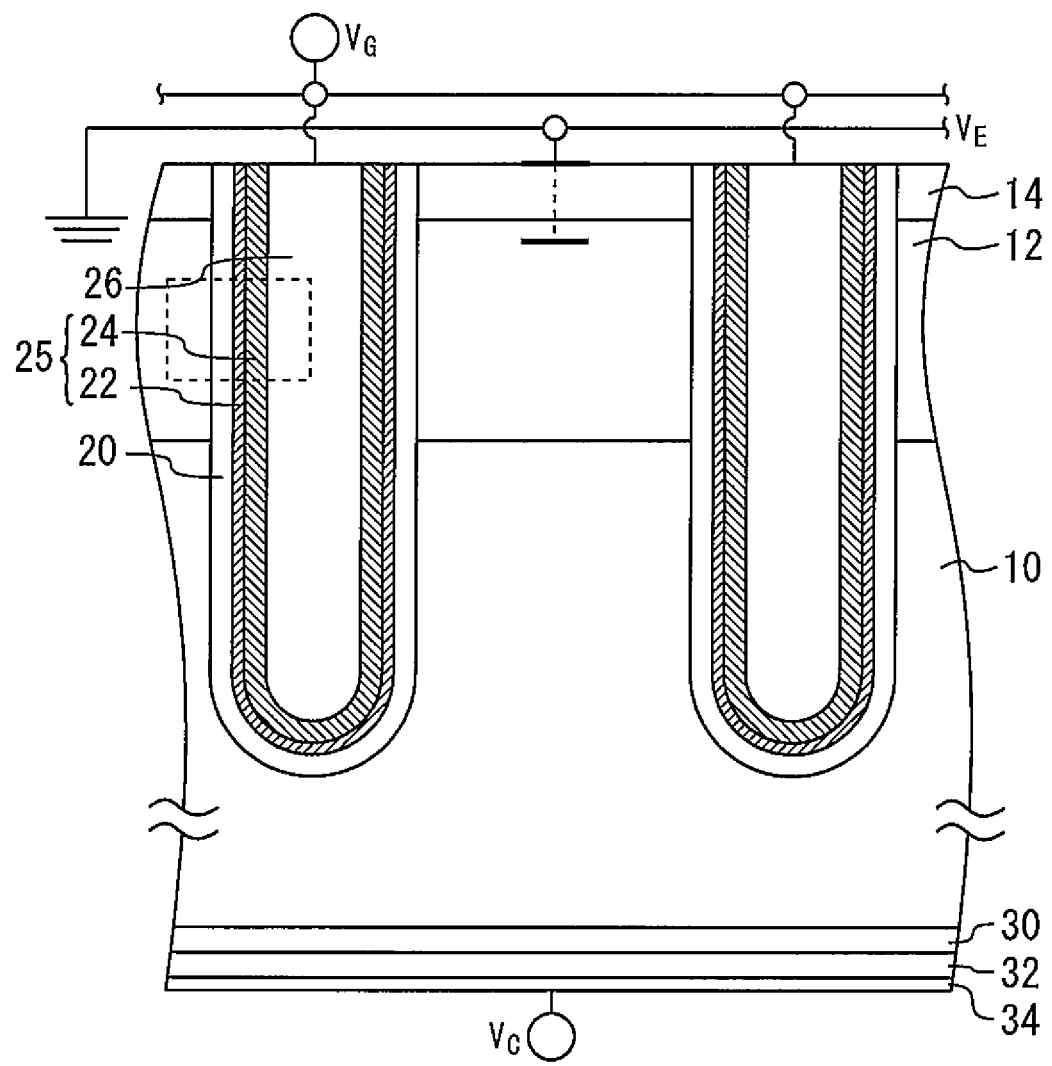
FIG. 1 is a cross-sectional view of a semiconductor device in accordance with a first embodiment of the present invention.

FIG. 1 is a cross-sectional view of a semiconductor device in accordance with a first embodiment of the present invention. This semiconductor device is an n-channel trench IGBT. The semiconductor device includes an n-type substrate 10 which has a very low impurity density and functions as a drift layer. A channel layer 12 is formed on the upper surface of the substrate 10. The channel layer is formed of p-type semiconductor having an impurity density of $1.0E17/cm^3$ and a relative permittivity of 11.7. An emitter layer 14 is formed on the channel layer 12. The emitter layer 14 is formed of n-type semiconductor having a high impurity density.

The trench structure will now be described. An insulating layer 20 is formed in contact with the channel layer 12. The insulating layer 20 has a thickness of 100 nm and a relative permittivity of 3.9. It should be noted that the thickness of the insulating layer 20 is decreased when the impurity density of the channel layer 12 is higher, and increased when the impurity density of the channel layer 12 is lower.

An impurity-doped first semiconductor layer 22 is formed on the opposite side of the insulating layer 20 from the channel layer 12. The first semiconductor layer 22 has a thickness of 16.2-24.0 nm and is formed of n-type polycrystalline semiconductor having an impurity density of $1.0E18/cm^3$ and a relative permittivity of 11.7.

An impurity-doped second semiconductor layer 24 is formed on the opposite side of the first semiconductor layer 22 from the insulating layer 20. The second semiconductor layer 24 is formed of n-type polycrystalline semiconductor having an impurity density of $1.0E15/cm^3$ and a relative permittivity of 11.7. The quotient of the impurity density of the first semiconductor layer 22 divided by the relative permittivity of the first semiconductor layer 22 is greater than the quotient of the impurity density of the second semiconductor layer 24 divided by the relative permittivity of the second semiconductor layer 24. It should be noted that the first semiconductor layer 22 and the second semiconductor layer 24 are sometimes hereinafter referred to collectively as the semiconductor layer 25.

A gate electrode 26 is formed on the opposite side of the second semiconductor layer 24 from the first semiconductor layer 22. The gate electrode 26 is preferably formed of high melting point metal of low resistance in order to reduce the gate wiring resistance. As can be seen from FIG. 1, the insulating layer 20, the first semiconductor layer 22, the second semiconductor layer 24, and the gate electrode 26 form a trench gate which penetrates through the channel layer 12 and the emitter layer 19 to the substrate 10.

An n-type buffer layer 30 is formed on the lower surface of the substrate 10. A p-type collector layer 32 is formed on the lower surface of the buffer layer 30. Therefore, the quantity of holes injected from the collector layer 32 into the substrate 10 is regulated by the buffer layer 30. A collector electrode 34 of metal is formed on the lower surface of the collector layer 32.

The collector electrode 34 is die-bonded to the patterning substrate, etc. of a module by solder, etc.

Figure 2:
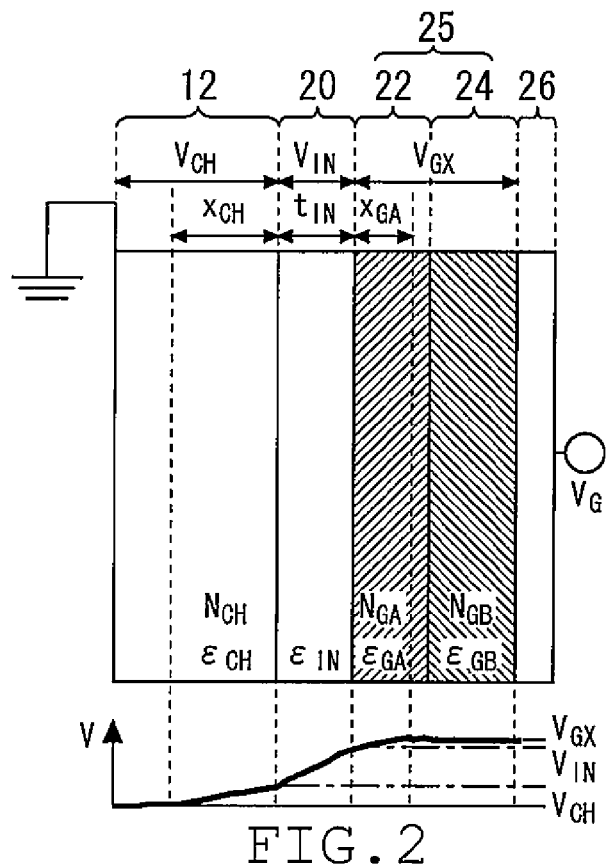
FIG. 2 is a diagram showing the lengths of the depletion layers in layers of the semiconductor device and the voltages across the layers of the semiconductor device when a voltage lower than the threshold voltage is applied to the gate electrode.

The operation of the semiconductor device of the first embodiment will now be described. FIG. 2 is a diagram showing the lengths of the depletion layers in layers of the semiconductor device and the voltages across the layers of the semiconductor device when a voltage lower than the threshold voltage is applied to the gate electrode. It should be noted that FIG. 2 is an enlarged view of the portion enclosed by the dashed line of FIG. 1. The dashed line shown in the channel layer 12 in FIG. 2 represents the outer edge of the depletion layer formed in the channel layer 12 (this depletion layer being hereinafter referred to as the channel depletion layer). Further, the dashed line shown in the first semiconductor layer 22 in FIG. 2 represents the outer edge of the depletion layer formed in the first semiconductor layer 22 (this depletion layer being hereinafter referred to as the first depletion layer). The length of the channel depletion layer is denoted by $X_{CH}$ and the length of the first depletion layer is denoted by $X_{GA}$.

The lower diagram of FIG. 2 shows the voltage across each layer. As can be seen from this diagram, most of the gate voltage is applied across the channel layer 12 and the insulating layer 20. The following equations may be used to calculate the electric charge Q generated in the channel layer 12, the capacitance $C_{CH}$ of the channel depletion layer, the capacitance $C_{GX}$ of the semiconductor layer 25, the capacitance $C_{IN}$ of the insulating layer 20, the voltage $V_{CH}$ across the channel layer 12, the voltage $V_{GX}$ across the semiconductor layer 25, the voltage $V_{IN}$ across the insulating layer 20, and the voltage $V_G$ applied to the gate electrode 26.

$$Q = qN_{CH} \cdot X_{CH} = qN_{GA} \cdot X_{GA}$$

$$C_{CH} = \varepsilon_{CH} / X_{CH}$$

$$C_{GX} = \varepsilon_{GA} / X_{GA}$$

$$C_{IN} = \varepsilon_{IN} / T_{IN}$$

$$V_{CH} = Q / C_{CH} = q / \varepsilon_{CH} \cdot N_{CH} \cdot X_{CH}^2$$

$$V_{GX} = Q / C_{GX} = q / \varepsilon_{GA} \cdot N_{GA} \cdot X_{GA}^2$$
$$= q / \varepsilon_{GA} \cdot N_{CH}^2 / N_{GA} \cdot X_{CH}^2$$

$$V_{IN} = Q / C_{IN} = q / \varepsilon_{IN} \cdot N_{CH} \cdot t_{IN} \cdot X_{IN}$$

$$V_G = V_{CH} + V_{IN} + V_{GX}$$
$$= q \cdot N_{CH} \cdot (1/\varepsilon_{CH} + 1/\varepsilon_{GA} \cdot N_{CH}/N_{GA}) \cdot X_{CH}^2 +$$
$$q / \varepsilon_{IN} \cdot N_{CH} \cdot t_{IN} \cdot X_{CH}$$

where q is the elementary charge of the electron and $t_{IN}$ is the thickness of the insulating layer 20. The symbols $N_{CH}$, $N_{GA}$, and $N_{GB}$ represent the impurity densities of the channel layer 12, the first semiconductor layer 22, and the second semiconductor layer 24, respectively. Further, the symbols $V_{CH}$, $V_{IN}$, $V_{GA}$, and $V_{GB}$ represent the voltages across the channel layer 12, the insulating layer 20, the first semiconductor layer 22, and the second semiconductor layer 24, respectively. The symbols $\varepsilon_{CH}$, $\varepsilon_{IN}$, $\varepsilon_{GA}$, and $\varepsilon_{GB}$ represent the relative permittivities of the channel layer 12, the insulating layer 20, the first semiconductor layer 22, and the second semiconductor layer 24, respectively.

The length $X_{CH}$ of the channel depletion layer and the length $X_{GA}$ of the first depletion layer are represented by the following equations, which are derived from the above mentioned equations.

$$X_{CH} = \frac{-(q/\varepsilon_{IN} \cdot N_{CH} \cdot t_{IN}) + \sqrt{\begin{array}{c}(q/\varepsilon_{IN} \cdot N_{CH} \cdot t_{IN})^2 + \\ 4qN_{CH}(1/\varepsilon_{CH} + 1/\varepsilon_{GA} \cdot N_{CH}/N_{GA}) \cdot V_G\end{array}}}{2qN_{CH}(1/\varepsilon_{CH} + 1/\varepsilon_{GA} \cdot N_{CH}/N_{GA})}$$

$$X_{GA} = \frac{-(q/\varepsilon_{IN} \cdot N_{CH} \cdot t_{IN}) + \sqrt{\begin{array}{c}(q/\varepsilon_{IN} \cdot N_{CH} \cdot t_{IN})^2 + \\ 4qN_{CH}(1/\varepsilon_{CH} + 1/\varepsilon_{GA} \cdot N_{CH}/N_{GA}) \cdot V_G\end{array}}}{2qN_{GA}(1/\varepsilon_{CH} + 1/\varepsilon_{GA} \cdot N_{CH}/N_{GA})}.$$

equations 1

Figure 3:
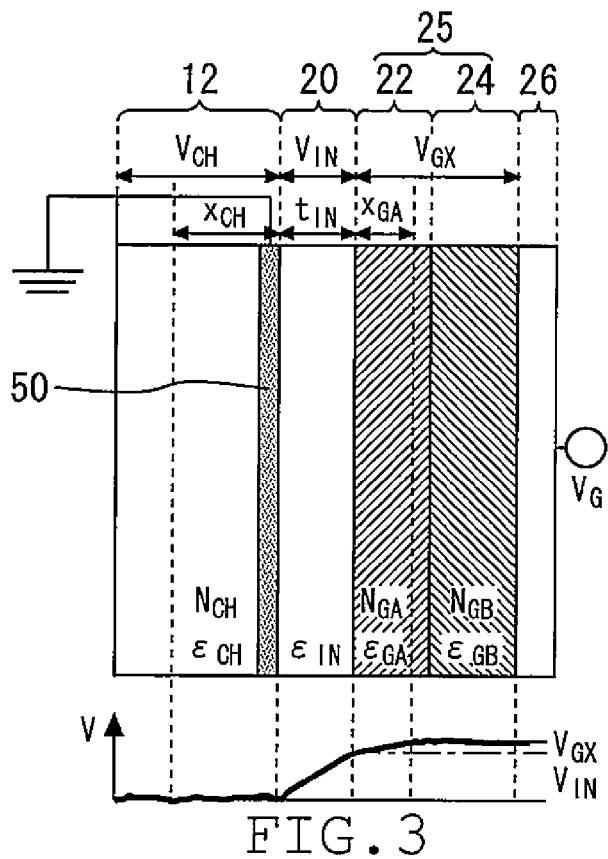
FIG. 3 is a diagram showing the lengths of the depletion layers in layers of the semiconductor device and the voltages across the layers of the semiconductor device when a voltage higher than the threshold voltage is applied to the gate electrode.

FIG. 3 is a diagram showing the lengths of the depletion layers in layers of the semiconductor device and the voltages across the layers of the semiconductor device when a voltage higher than the threshold voltage is applied to the gate electrode. As shown, an inversion layer 50 is formed in the channel layer 12. The inversion layer 50 is at substantially 0 V. In the case shown in FIG. 3, the voltages $V_{CH}$ and $V_{IN}$ across the channel layer 12 and the insulating layer 20, respectively, and the gate voltage $V_G$ are governed by the following equations, which are different than those given in connection with FIG. 2.

$$V_{CH} = 0$$

$$V_{IN} = Q/C_{IN} = q/\varepsilon_{IN} \cdot N_{CH} \cdot t_{IN} \cdot X_{CH}$$

$$V_G = V_{CH} + V_{IN} + V_{GX}$$
$$= q/\varepsilon_{GA} \cdot N_{CH}^2/N_{GA} \cdot X_{CH}^2 + q/\varepsilon_{IN} \cdot N_{CH} \cdot t_{IN} \cdot X_{CH}$$

In the case shown in FIG. 3, the length $X_{GA}$ of the first depletion layer is represented by the following equation:

$$X_{GA} = \frac{-(q/\varepsilon_{IN} \cdot t_{IN}) + \sqrt{(q/\varepsilon_{IN} \cdot t_{IN})^2 + 4q/\varepsilon_{GA}/N_{GA} \cdot V_G}}{2q/\varepsilon_{GA}}.$$

equation 2

Figure 4:
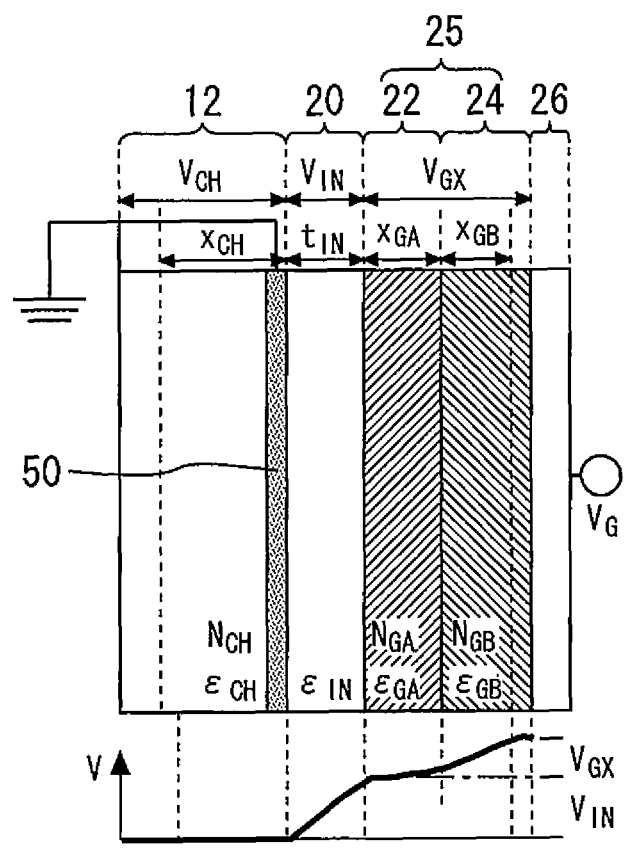
FIG. 4 is a diagram showing the lengths of the depletion layers in layers of the semiconductor device and the voltages across the layers of the semiconductor device when the voltage applied to the gate electrode is higher than that in FIG. 3.

FIG. 4 is a diagram showing the lengths of the depletion layers in layers of the semiconductor device and the voltages across the layers of the semiconductor device when the voltage applied to the gate electrode is higher than that in FIG. 3. As shown, the length $X_{GA}$ of the first depletion layer is equal to the thickness of the first semiconductor layer 22. The dashed line shown in the second semiconductor layer 24 in FIG. 4 represents the outer edge of the depletion layer formed in the second semiconductor layer 24 (this depletion layer being hereinafter referred to as the second depletion layer). The length of the second depletion layer is denoted by $X_{GB}$. As can be seen from FIG. 4, when the gate voltage is increased beyond the voltage at which the inversion layer 50 forms in the channel layer 12, a high voltage is applied across the second semiconductor layer 24 as well as across the channel layer 12 and the insulating layer 20. As shown in FIG. 4, when an on-voltage is applied to the gate electrode 26 so that a saturation current flows through the semiconductor device, a depletion layer forms to occupy the entire first semiconductor layer 22 and a portion of the second semiconductor layer 24.

In the case shown in FIG. 4, Q, $C_{GX}$, $V_{CH}$, $V_{GX}$, $V_{IN}$, and $V_G$ are governed by the following equations, which are different than those given in connection with FIG. 2.

$$Q = qN_{CH} \cdot X_{CH} = q(N_{GA} \cdot X_{GA} + N_{GB} \cdot X_{GB})$$

$$C_{GX} = \varepsilon_{GA} \cdot \varepsilon_{GA}/(\varepsilon_{GB} \cdot X_{GA} + \varepsilon_{GA} \cdot X_{GB})$$

$$V_{CH} = 0$$

$$V_{GX} = Q/C_{CX} =$$
$$q \cdot (N_{GA} \cdot X_{GA} + N_{GB} \cdot X_{GB}) \times (\varepsilon_{GB} \cdot X_{GA} + \varepsilon_{GA} \cdot X_{GB})/(\varepsilon_{GA} \cdot \varepsilon_{GB})$$

$$V_{IN} = Q/C_{IN} = q/\varepsilon_{IN} \cdot N_{CH} \cdot t_{IN} \cdot X_{CH}$$

$$V_G = V_{CH} + V_{IN} + V_{GX}$$
$$= q \cdot N_{GB} \cdot \varepsilon_{GB} X_{GB}^2 + q \cdot N_{GA} \cdot N_{GB} \cdot B_1 \cdot X_{GB} +$$
$$q \cdot N_{GA} \cdot X_{GA} \cdot (L_{GA}/\varepsilon_{GA} + t_{IN}/\varepsilon_{IN})$$

The length $X_{GB}$ of the second depletion layer is represented by the following equations:

$$X_{GB} = \frac{-(q \cdot N_{GA} \cdot N_{GB} \cdot B_1) + \sqrt{\begin{array}{c}((q \cdot N_{GA} \cdot N_{GB} \cdot B_1)^2 - 4qN_{GB}/\varepsilon_{GB} \cdot \\ (q \cdot N_{GA} \cdot X_{GA} \cdot B_2 - V_G))\end{array}}}{2qN_{GB}/\varepsilon_{GB}}$$

equations 3

$$B_1 = X_{GA}/\varepsilon_{GA}/N_{GA} + X_{GA}/\varepsilon_{GB}/N_{GB} + t_{IN}/\varepsilon_{IN}/N_{GA}$$

$$B_2 = X_{GM}/\varepsilon_{GA} + t_{IN}/\varepsilon_{IN} ..$$

Figure 5:
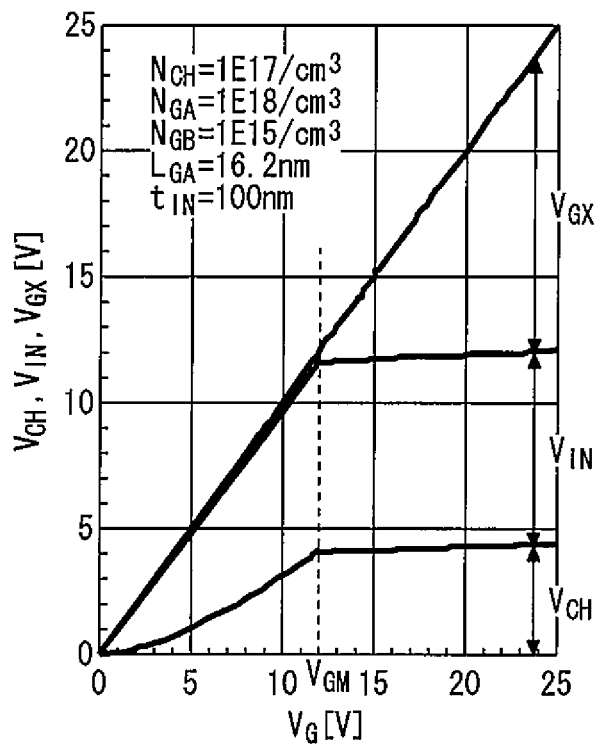
FIG. 5 is a graph showing the voltages across layers of the semiconductor device as a function of the gate voltage VG, wherein the thickness of the first semiconductor layer is such that an inversion layer does not form in the channel layer.

FIG. 5 is a graph showing the voltages across layers of the semiconductor device as a function of the gate voltage $V_G$, wherein the thickness of the first semiconductor layer 22 is such that an inversion layer does not form in the channel layer 12. In this graph, $V_{GM}$ denotes the gate voltage at which a depletion layer forms to occupy the entire first semiconductor layer 22. When the gate voltage is lower than $V_{GM}$, a depletion layer forms in only a portion of the first semiconductor layer 22; and when the gate voltage is higher than $V_{GM}$, a depletion layer extends through the entire first semiconductor layer 22 into the second semiconductor layer 24. The gate voltage $V_{GM}$ is referred to as the transition voltage, since the depletion layer in the semiconductor layer 25 extends beyond the first semiconductor layer 22 into the second semiconductor layer 24 when the gate voltage is higher than the transition voltage $V_{GM}$. As can be seen from FIG. 5, the voltage $V_{GX}$ across the semiconductor layer 25 is substantially zero when the gate voltage is $V_{GM}$ or less. As the gate voltage $V_G$ increases beyond the transition voltage $V_{GM}$ the voltage $V_{GX}$ increases significantly, but the voltages $V_{CH}$ and $V_{IN}$ across the channel layer 12 and the insulating layer 20, respectively, increase only slightly.

Figure 6:
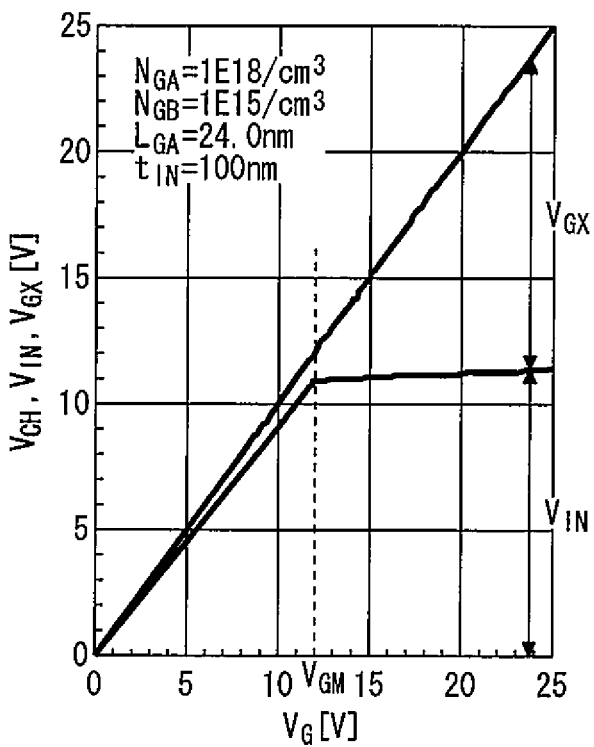
FIG. 6 is a graph showing the voltages across layers of the semiconductor device as a function of the gate voltage VG, wherein the thickness of the first semiconductor layer is such that an inversion layer forms in the channel layer.

FIG. 6 is a graph showing the voltages across layers of the semiconductor device as a function of the gate voltage $V_G$, wherein the thickness of the first semiconductor layer 22 is such that an inversion layer forms in the channel layer 12. The voltage $V_{CH}$ across the channel layer 12 is substantially 0 V as a result of the formation of the inversion layer. As the gate voltage $V_G$ is increased to and beyond the transition voltage $V_{GM}$, the voltages $V_{GX}$ and $V_{IN}$ increase in the same manner as that shown in FIG. 5. It should be noted that, in the actual implementation of the semiconductor device of the first embodiment, the thickness of the first semiconductor layer 22 is such that: when the gate voltage $V_G$ is relatively low, it is distributed across the channel layer 12, the insulating layer 20, and the semiconductor layer 25 in the same manner as that shown in FIG. 5; and when the gate voltage $V_G$ is relatively high, it is distributed across the insulating layer 20 and the semiconductor layer 25 in the same manner as that shown in FIG. 6. As described above, in the semiconductor device shown in FIG. 5, the thickness of the first semiconductor layer 22 "$L_{GA}$" is such that a channel region does not form in the channel layer 12 at the transition voltage $V_{GM}$ (12 V), whereas in the semiconductor device shown in FIG. 6 the thickness of the first semiconductor layer 22 "$L_{GA}$" is such that a channel region fully forms in the channel layer 12 at the transition voltage $V_{GM}$ (12 V). That is, in the actual implementation the thickness of the first semiconductor layer 22 may be such that no channel region forms in the channel layer 12 at the transition voltage $V_{GM}$ or such that a channel region fully or partially forms in the channel layer 12 at $V_{GM}$. This means that the first semiconductor layer 22 may have a thickness in the range of 16.2-24.0 nm such that it is possible to minimize the increases in $V_{IN}$ and $V_{CH}$ and thereby substantially prevent increase in the saturation current when the gate voltage $V_G$ is increased to and beyond 12 V.

Figure 7:
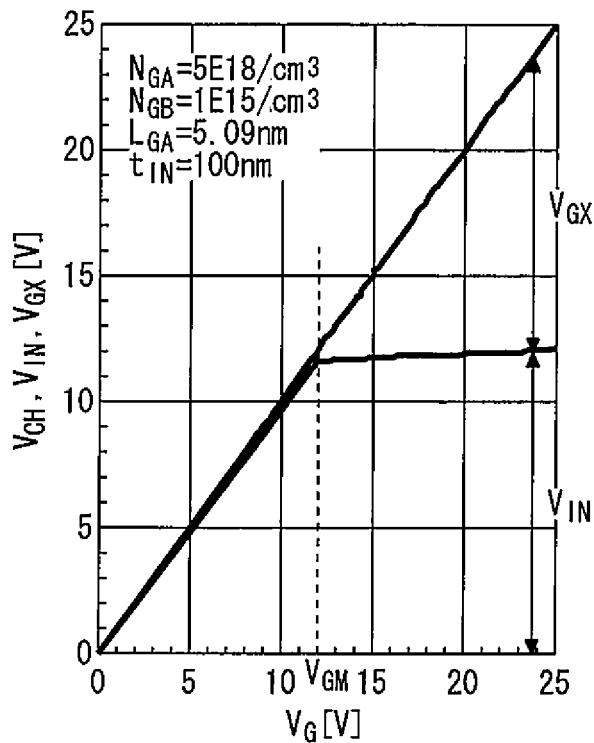
FIG. 7 is a graph showing the voltages across layers of the semiconductor device of FIG. 6, wherein the impurity density of the first semiconductor layer has been increased.

FIG. 7 is a graph showing the voltages across layers of the semiconductor device of FIG. 6, wherein the impurity density of the first semiconductor layer 22 has been increased. Specifically, the impurity density of the first semiconductor layer 22 is 5E18/cm³. It should be noted that if the impurity density of the first semiconductor layer 22 is increased, then it is necessary to reduce its thickness. The result is that the first semiconductor layer 22 is a very thin layer and high precision processing is required to form the first semiconductor layer 22. This means that excessive increase in the impurity density of the first semiconductor layer 22 results in increased variations in the transition voltage $V_{GM}$.

Figure 8:
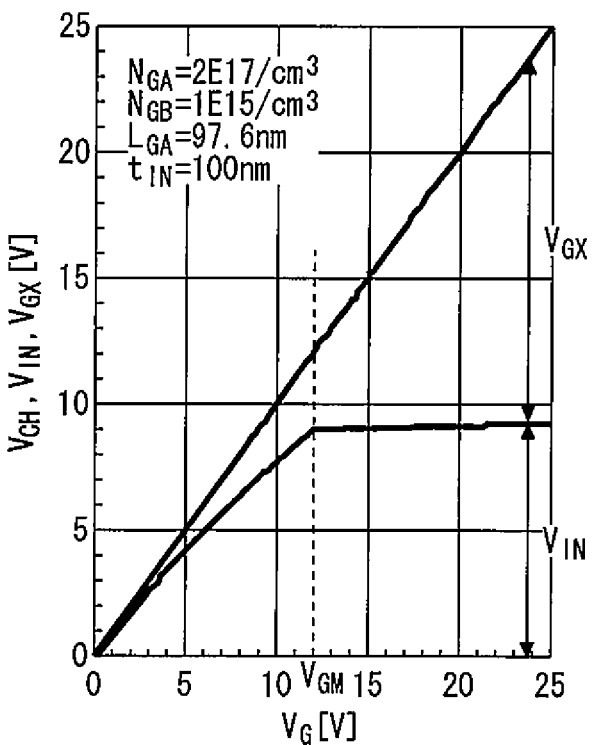
FIG. 8 is a graph showing the voltages across layers of the semiconductor device of FIG. 6, wherein the impurity density of the first semiconductor layer has been decreased.

FIG. 8 is a graph showing the voltages across layers of the semiconductor device of FIG. 6, wherein the impurity density of the first semiconductor layer 22 has been decreased. Specifically, the impurity density of the first semiconductor layer 22 is 2E17/cm³. In this semiconductor device, the voltage $V_{GX}$ across the semiconductor layer 25 is significant when the gate voltage is equal to or lower than the transition voltage V. This means that it is difficult to increase the voltage $V_{IN}$ across the insulating layer 20 at gate voltages not exceeding $V_{GM}$. Therefore, the impurity density of the first semiconductor layer 22 should not be excessively low.

In the actual implementation of the semiconductor device of the first embodiment, the thickness of the first semiconductor layer 22 "$L_{GA}$" is selected to satisfy the following equations in order to ensure that when the gate voltage is equal to the transition voltage $V_{GM}$, a depletion layer forms to occupy the entire first semiconductor layer 22:

$$L_{GA} \geq \frac{-(q/\varepsilon_{IN} \cdot t_{IN}) + \sqrt{(q/\varepsilon_{IN} \cdot t_{IN})^2 + 4q(1/\varepsilon_{CH}/N_{CH} + 1/\varepsilon_{GA}/N_{GA}) \cdot V_{GM}}}{2qN_{GA}(1/\varepsilon_{CH}/N_{CH} + 1/\varepsilon_{GA}/N_{GA})}$$

$$L_{GA} \leq \frac{-(q/\varepsilon_{IN} \cdot t_{IN}) + \sqrt{(q/\varepsilon_{IN} \cdot t_{IN})^2 + 4q/\varepsilon_{GA}/N_{GA} \cdot V_{GM}}}{2q/\varepsilon_{GA}}$$

inequalities 4 where
$L_{GA}$ = the thickness of the first semiconductor layer
$\varepsilon_{IN}$ = the relative permittivity of the gate insulating film
$\varepsilon_{CH}$ = the relative permittivity of the channel layer
$\varepsilon_{GA}$ = the relative permittivity of the first semiconductor layer
$t_{IN}$ = the thickness of the gate insulating film
$N_{CH}$ = the impurity density of the depletion layer in the channel layer
$N_{GA}$ = the impurity density of the first semiconductor layer
$V_{GM}$ = the gate voltage at which a depletion layer forms to occupy the entire first semiconductor layer.

Figure 9:
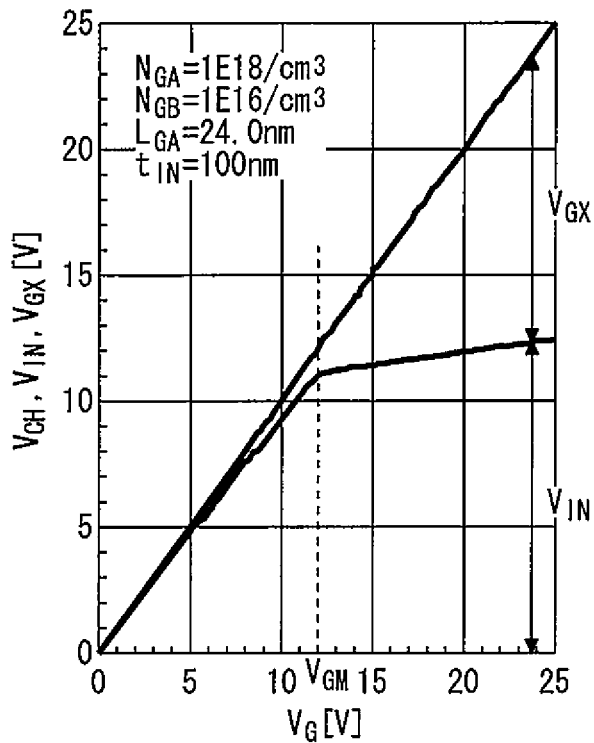
FIG. 9 is a graph showing the voltages across layers of semiconductor device of FIG. 6, wherein the impurity density of the second semiconductor layer is higher than 1E15/cm3.
Figure 10:
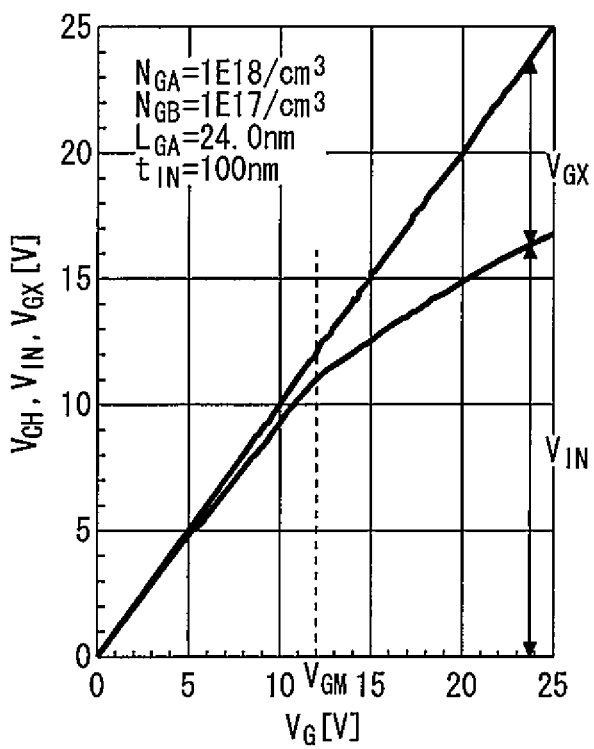
FIG. 10 is a graph showing the voltages across layers of semiconductor device of FIG. 6, wherein the impurity density of the second semiconductor layer is higher than 1E15/cm3.

FIGS. 9 and 10 are graphs showing the voltages across layers of semiconductor device of FIG. 6, wherein the impurity density of the second semiconductor layer 24 is higher than 1E15/cm³. Specifically, the second semiconductor layer of the semiconductor device shown in FIG. 9 has an impurity density of 1E16/cm³, and the second semiconductor layer of the semiconductor device shown in FIG. 10 has an impurity density of 1E17/cm³. In either semiconductor device, the rate of increase of the voltage $V_{IN}$ across the insulating layer 20 with respect to the gate voltage $V_G$ slows down when the gate voltage $V_G$ exceeds the transition voltage $V_{GM}$ (12 V), but is still faster than that exhibited by the semiconductor device described above with reference to FIG. 6. The reason for this is that when the impurity density of the second semiconductor layer 24 is relatively high, the depletion layer formed therein does not extend significantly toward the gate electrode resulting in failure to increase the voltage $V_{GX}$ across the semiconductor layer 25. In order to increase the voltage $V_{GX}$ across the semiconductor layer 25 and thereby reduce the voltage $V_{IN}$ across the insulating layer 20 when the gate voltage is higher than the transition voltage $V_{GM}$, it is preferable to minimize the impurity density of the second semiconductor layer 24; specifically, the impurity density of the second semiconductor layer 24 should preferably be one-tenth or less that of the first semiconductor layer 22.

It should be noted that excessive decrease in the impurity density of the second semiconductor layer 24 results in the second depletion layer reaching the gate electrode 26, beyond which the depletion layer does not extend even if the gate voltage is increased. This also results in increased resistance of the second semiconductor layer 24, thereby increasing the wiring resistance formed by the gate electrode 26, the second semiconductor layer 24, etc. In order to avoid these problems, it is necessary that the second semiconductor layer 24 have a suitable impurity density and a suitable thickness, determined in accordance with Equations 3.

Figure 11:
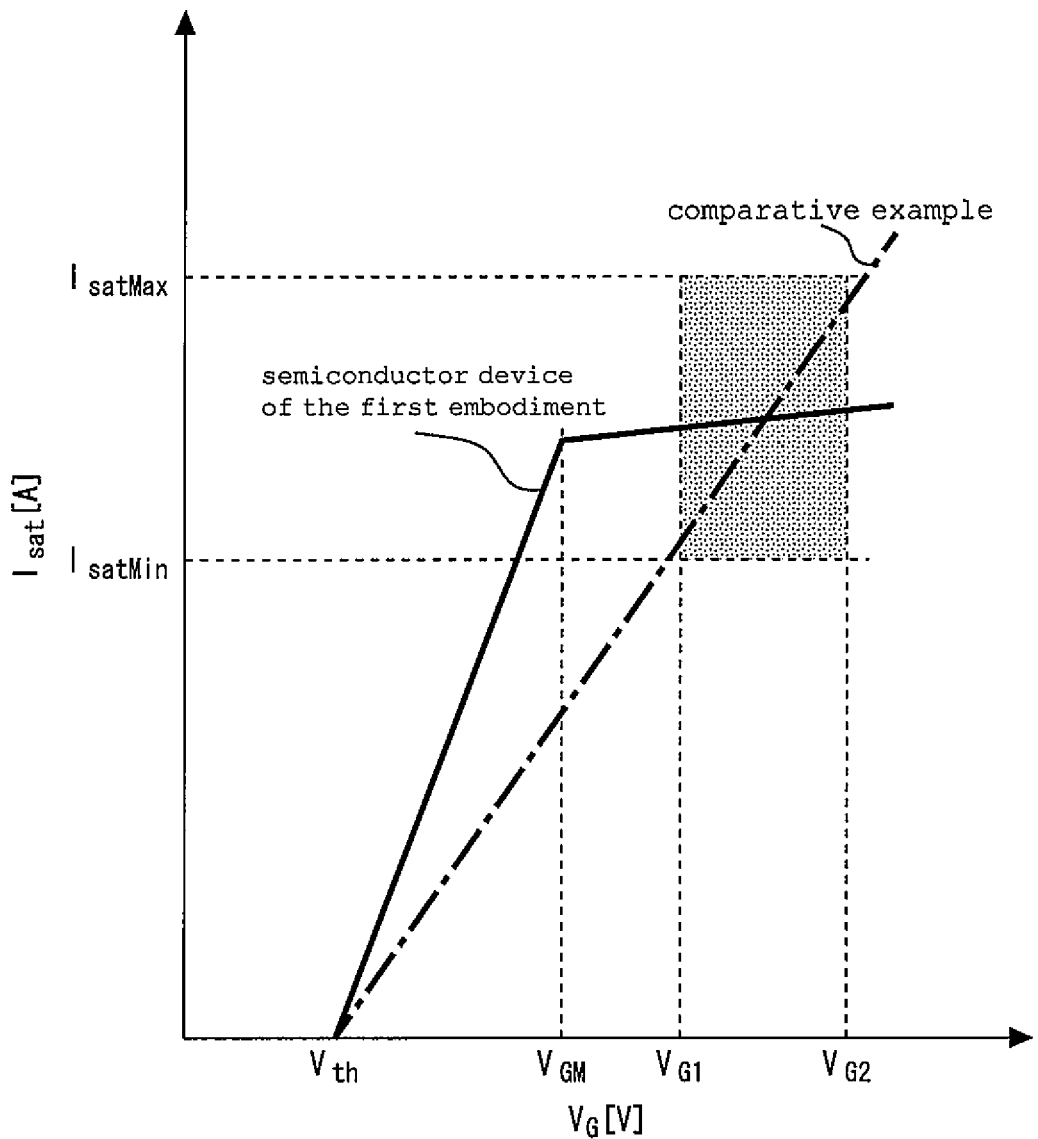
FIG. 11 is a graph showing the relationship between the gate voltage and the saturation current of the semiconductor device of the first embodiment.

FIG. 11 is a graph showing the relationship between the gate voltage and the saturation current of the semiconductor device of the first embodiment. It should be noted that the saturation current of a semiconductor device varies due to various factors. Therefore, when a certain range of gate voltages are applied to the gate, the saturation current of the semiconductor device must be within the range between the allowable maximum saturation current IsatMax and the allowable minimum saturation current IsatMin which are determined by taking a margin into account.

The allowable minimum saturation current IsatMin is the minimum saturation current that must be sustained even if the gate voltage $V_G$ has fallen to a voltage $V_{G1}$ (see FIG. 11) due to factors associated with the gate driver or parasitic inductance. The allowable maximum saturation current IsatMax is the maximum saturation current that does not cause any damage to the semiconductor device during the period after the semiconductor device is turned on (i.e., put in a short-circuit state) by applying a gate voltage $V_{G2}$ (see FIG. 11) to the semiconductor device with the main voltage applied thereto until the protection mechanism takes effect. That is, the allowable maximum saturation current IsatMax is the maximum saturation current permitted to flow through the semiconductor device in the above conditions and depends on the short circuit capacity of the semiconductor device. In accordance with the first embodiment, the transition voltage $V_{GM}$ is set to be between $V_{G1}$ and $V_{G2}$, so that the saturation current Isat at the transition voltage $V_{GM}$ is between IsatMin and IsatMax. It should be noted, however, that the transition voltage $V_{GM}$ may be set differently than the setting described above, since it is still possible to reduce the voltage across the gate insulating film and increase the gate breakdown voltage by forming a depletion layer in the semiconductor layer of the gate.

In the semiconductor device of the first embodiment, the saturation current Isat at the gate transition voltage $V_{GM}$ is set to be between the allowable maximum saturation current IsatMax and the allowable minimum saturation current IsatMin. This makes it possible to slow down the rate of change of the saturation current with respect to changes in the gate voltage when the gate voltage is higher than the transition voltage $V_{GM}$. In other words, the semiconductor device can exhibit the required transfer characteristic with an adequate margin even if the difference between IsatMax and IsatMin is small. As a result, it is possible to reduce the power loss in the semiconductor device, as well as reducing its size. It should be noted that FIG. 11 also shows, as a comparative example, the transfer characteristic of a typical IGBT in which the semiconductor layer 25 has a high uniform impurity density. As shown, the rate of change of the saturation current of this typical IGBT with respect to its gate voltage is high, meaning that the saturation current of the IGBT may increase beyond IsatMax or decrease beyond IsatMin when the IGBT is of a reduced size and hence the difference between IsatMax and IsatMin is small.

In the semiconductor device of the first embodiment, when the gate voltage is lower than the transition voltage $V_{GM}$, the depletion layer formed in the semiconductor layer 25 extends only slightly toward the gate electrode, so that a substantial voltage is not applied across the semiconductor layer 25, thus increasing the voltage across the channel layer 12. This ensures that the semiconductor device has an adequately low threshold voltage and high current drive even if the insulating layer is thin and the impurity density of the channel layer is high, making it possible to prevent short channel effect and latch-up.

When the gate voltage is higher than the transition voltage $V_{GM}$, on the other hand, the depletion layer formed in the first semiconductor layer 22 extends into the second semiconductor layer 24 and, as a result, a high voltage is applied across the semiconductor layer 25 (which is made up of the first semiconductor layer 22 and the second semiconductor layer 24). This reduces the voltages applied across the channel layer 12 and the insulating layer 20, making it possible to enhance prevention of breakdown of the insulating layer 20. Since the voltage across the insulating layer 20 is maintained low, the semiconductor device has improved reliability in terms of being immune to a surge voltage applied to the gate electrode 26.

The low impurity density of the second semiconductor layer 24 of the semiconductor device of the first embodiment serves to increase the resistance of the device. This resistance increasing effect, however, may be reduced or compensated for by the fact that the gate electrode 26 is formed of low resistance material such as a high melting point metal layer.

The advantages of the semiconductor device of the first embodiment described above result from the fact that the depletion layer formed in the semiconductor layer 25 does not extend into the second semiconductor layer 24 when the gate voltage is lower than the transition voltage $V_{GM}$, and extends into the second semiconductor layer 24 when the gate voltage is higher than the transition voltage $V_{GM}$. This means that the above advantages can also be obtained when the relative permittivity of the first semiconductor layer 22 is lower than that of the second semiconductor layer 24. That is, the above advantages of the semiconductor device of the first embodiment can be obtained by adjusting the impurity densities and relative permittivities of the first semiconductor layer 22 and the second semiconductor layer 24. More specifically, the above advantages can be obtained when the quotient of the impurity density of the first semiconductor layer 22 divided by the relative permittivity of the first semiconductor layer 22 is greater than the quotient of the impurity density of the second semiconductor layer 24 divided by the relative permittivity of the second semiconductor layer 24.

Various alterations may be made to the semiconductor device of the first embodiment. For example, the present invention is not limited to trench IGBTs, but may be applied to a variety of MOS devices having a gate electrode to which a voltage is applied. Further, the present invention is not limited to enhancement-type MOS devices, but may be applied to depletion-type MOS devices. Further, the semiconductor device of the first embodiment may be configured as a p-channel MOS device by reversing the conductivity type of each layer of the device and the polarity of the voltage applied to the layer. When the semiconductor device to which the present invention is applied is of the type in which a positive voltage is applied to the gate electrode, the first and second semiconductor layers are doped with impurities so that these semiconductor layers exhibit N-type conductivity. When a negative voltage is applied to the gate electrode, on the other hand, the first and second semiconductor layers are doped with impurities so that these semiconductor layers exhibit P-type conductivity. Examples of such impurities include B.

Figure 12:
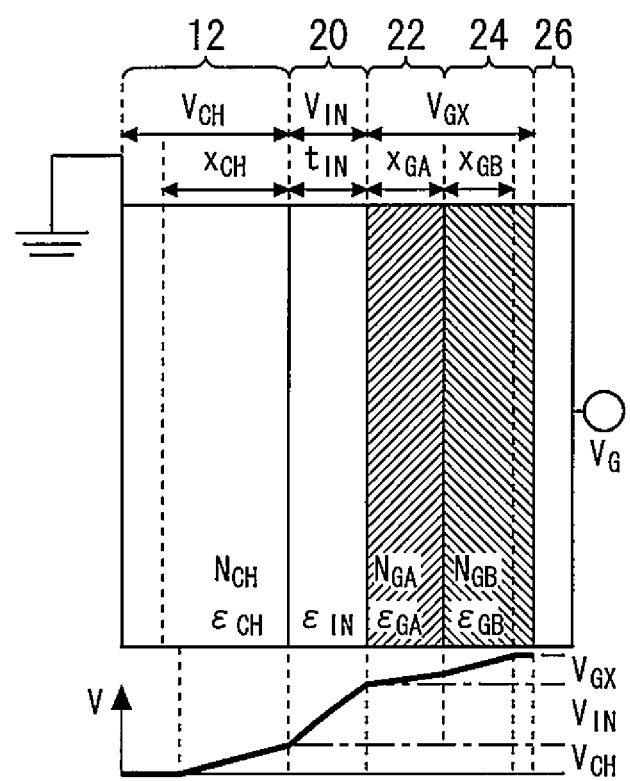
FIG. 12 is a diagram showing the voltages across the layers of a variation of the semiconductor device of the first embodiment and the length of the depletion layer in each layer.

In the semiconductor device of the first embodiment, the depletion layer formed in the first semiconductor layer 22 extends into the second semiconductor layer 24 when a voltage higher than the transition voltage $V_{GM}$ (which in turn is higher than the threshold voltage Vth) is applied to the gate. In other embodiments, however, the semiconductor device may be configured such that the depletion layer formed in the first semiconductor layer 22 extends into the second semiconductor layer 24 even when the voltage applied to the gate is lower than the voltage at which an inversion layer forms in the channel layer 12. FIG. 12 is a diagram showing the voltages across the layers of a variation of the semiconductor device of the first embodiment and the length of the depletion layer in each layer.

The impurity densities of the first semiconductor layer 22 and the second semiconductor layer 24 may not be uniform throughout the layers. Further, the impurity densities of the channel layer and the first and second semiconductor layers can be varied as long as the advantages of the first embodiment described above are retained.

A low resistance layer which has a lower resistance than the second semiconductor layer 24 and serves as a stopper for the depletion layer in the second semiconductor layer 24 may be formed between the second semiconductor layer 24 and the gate electrode 26. This low resistance layer may be regarded as part of the gate electrode 26.

Although the substrate 10 is typically formed of silicon, it may be formed of a wide bandgap semiconductor having a wider bandgap than silicon. Examples of wide bandgap semiconductors include silicon carbide, gallium nitride-based materials, and diamond.

Second Embodiment

Figure 13:
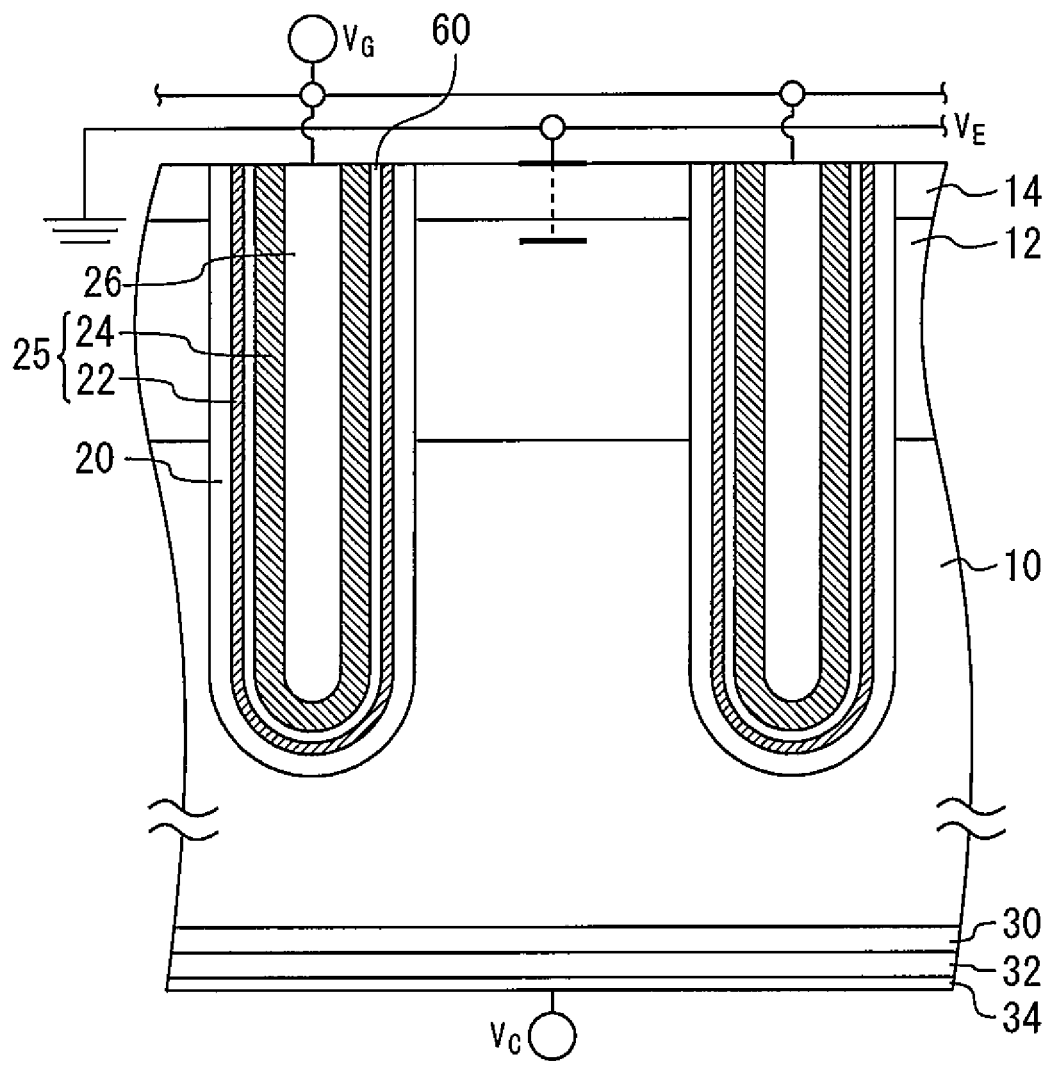
FIG. 13 is a cross-sectional view of the semiconductor device of the second embodiment.

A second embodiment of the present invention provides a semiconductor device which has many features common to the semiconductor device of the first embodiment. Therefore, the following description of the second embodiment will be primarily limited to the differences from the first embodiment. FIG. 13 is a cross-sectional view of the semiconductor device of the second embodiment. A barrier layer 60 having a lower impurity diffusion coefficient than the second semiconductor layer 24 is formed between the first semiconductor layer 22 and the second semiconductor layer 24. The material of this barrier layer 60 may be any one of semiconductor, insulator, and metal. If the barrier layer 60 is formed of insulator, however, care must be taken so that the semiconductor device has the same advantages as those described in connection with the semiconductor device of the first embodiment, since the barrier layer 60 may affect the capacitance of the insulating layer 20 and the movement of charge between the first and second semiconductor layers.

The barrier layer 60 serves to prevent impurities from diffusing from the first semiconductor layer 22 into the second semiconductor layer 24 due to thermal treatment, etc. This provides an additional degree of process freedom. The semiconductor device of the second embodiment is susceptible of alterations at least similar to those that can be made to the semiconductor device of the first embodiment.

Third Embodiment

Figure 14:
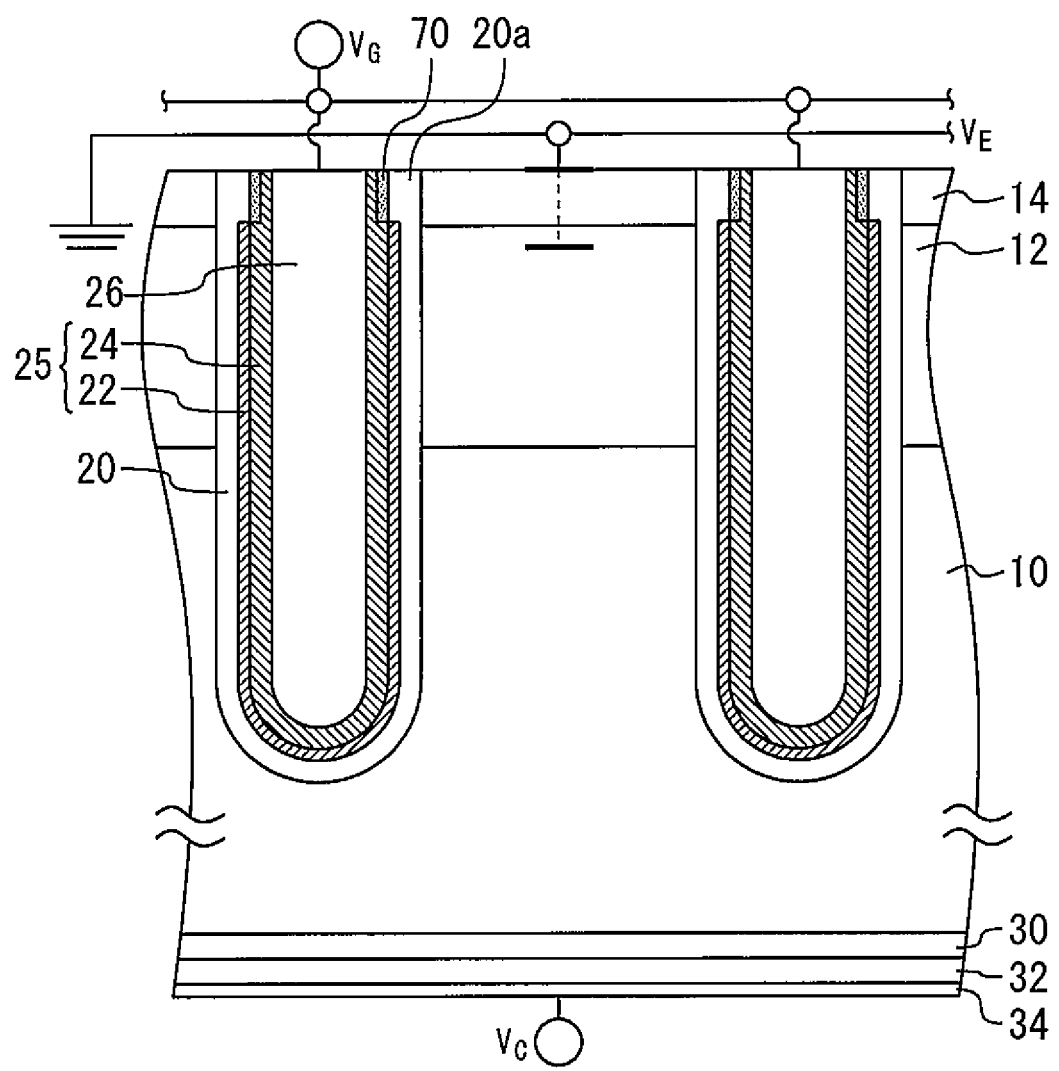
FIG. 14 is a cross-sectional view of the semiconductor device of the third embodiment.

A third embodiment of the present invention provides a semiconductor device which has many features common to the semiconductor device of the first embodiment. Therefore, the following description of the third embodiment will be primarily limited to the differences from the first embodiment. FIG. 14 is a cross-sectional view of the semiconductor device of the third embodiment. The insulating layer 20 has a thick portion 20a. This portion 20a is in contact with the emitter layer 14. That is, the portion 20a of the insulating layer 20 which is in contact with the emitter layer 14 is thicker than the portion of the insulating layer 20 in contact with the channel layer 12. Further, the portion 70 of the first semiconductor layer 22 which penetrates through the emitter layer 14 has a higher impurity density than the portion of the first semiconductor layer 22 which penetrates through the channel layer 12.

Since the electric field in the emitter layer 14 does not contribute much to the current drive of the channel, it is not desirable that much of the gate voltage is dropped across the portion of the trench structure in contact with the emitter layer 14. Therefore, in the semiconductor device of the third embodiment, the portion 20a of the insulating layer 20 which is in contact with the emitter layer 14 is formed to be thicker than the other portion of the insulating layer 20, and the portion 70 of the first semiconductor layer 22 which penetrates through the emitter layer 14 is formed to have a higher impurity density than the other portion of the first semiconductor layer 22, thereby reducing the gate voltage drop across the portion of the trench structure in contact with the emitter layer 14. This increases the gate voltage applied across the portion of the gate structure in contact with the channel layer 12.

The above advantages of the third embodiment may be achieved merely by forming the thick portion 20a of the insulating layer 20 or by increasing the impurity density of the portion 70 of the first semiconductor layer 22. The semiconductor device of the third embodiment is susceptible of alterations at least similar to those that can be made to the semiconductor device of the first embodiment.

Fourth Embodiment

A semiconductor device in accordance with a fourth embodiment of the present invention is configured as a MOS transistor having a structure including an insulating layer, a first semiconductor layer, a second semiconductor layer, and a gate electrode which are similar to those described in connection with the first embodiment.

Figure 15:
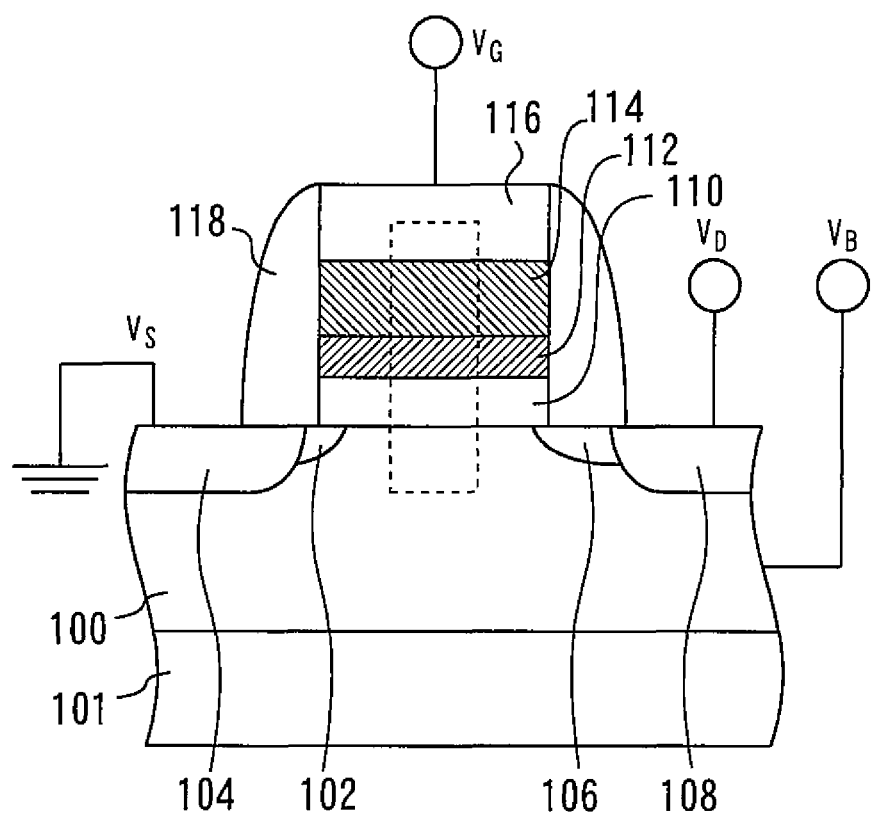
FIG. 15 is a cross-sectional view of the semiconductor device of the fourth embodiment.

FIG. 15 is a cross-sectional view of the semiconductor device of the fourth embodiment. This semiconductor device includes a channel layer 100 formed on a substrate 101. The channel layer 100 is formed of a p-type semiconductor layer having an impurity density of $1.0E18/cm^3$ and a relative permittivity of 11.7. Sources 102 and 104 and drains 106 and 108 are formed on the upper surface side of the channel layer 100. It should be noted that the source 102 has a lower impurity density than the source 104. Further, the drain 106 has a lower impurity density than the drain 108.

An insulating layer 110 is formed on the upper surface of the channel layer 100. The insulating layer 110 has a thickness of 10 nm and a relative permittivity of 3.9. A first semiconductor layer 112 on the insulating layer 110 is formed of an n-type polycrystalline semiconductor layer having an impurity density of $1.0E19/cm^3$, a thickness of 3.05-5.47 nm, and a relative permittivity of 11.7.

A second semiconductor layer 114 on the first semiconductor layer 112 is formed of an n-type polycrystalline semiconductor layer having an impurity density of $1.0E16/cm^3$ and a relative permittivity of 11.7. A gate electrode 116 on the second semiconductor layer 114 is formed of high-melting point metal of low resistance. Sidewalls 118 are formed on the side surfaces of the first semiconductor layer 112 and the second semiconductor layer 114.

Figure 16:
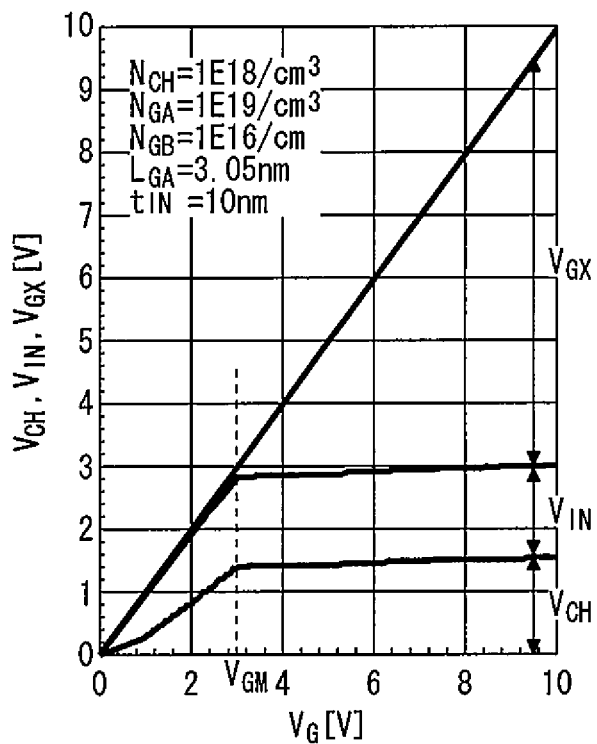
FIG. 16 is a graph showing the voltages across layers of the semiconductor device of the fourth embodiment as a function of the gate voltage VG, wherein the thickness of the first semiconductor layer is such that a channel region does not form in the channel layer at the transition voltage VGM.
Figure 17:
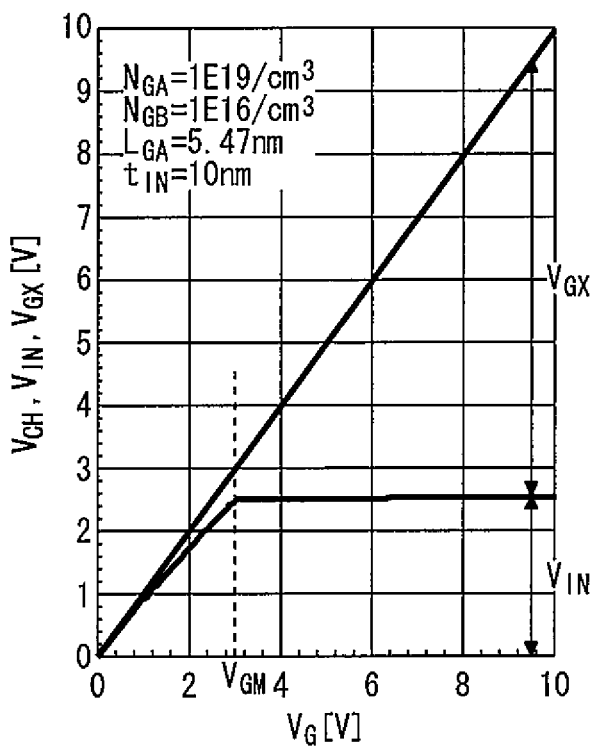
FIG. 17 is a graph showing the voltages across layers of the semiconductor device of the fourth embodiment as a function of the gate voltage VG, wherein the thickness of the first semiconductor layer is such that a channel region fully forms in the channel layer at the transition voltage VGM.

FIG. 16 is a graph showing the voltages across layers of the semiconductor device of the fourth embodiment as a function of the gate voltage $V_G$, wherein the thickness of the first semiconductor layer 112 is such that a channel region does not form in the channel layer 100 at the transition voltage $V_{GM}$ (3V). FIG. 17 is a graph showing the voltages across layers of the semiconductor device of the fourth embodiment as a function of the gate voltage $V_G$, wherein the thickness of the first semiconductor layer 112 is such that a channel region fully forms in the channel layer 100 at the transition voltage $V_{GM}$ (3V). That is, in the actual implementation of the semiconductor device of the fourth embodiment, the thickness of the first semiconductor layer 112 may be such that no channel forms in the channel layer 100 at the transition voltage $V_{GM}$ or such that a channel fully or partially forms in the channel layer 100 at the transition voltage $V_{GM}$. This means that the first semiconductor layer 112 may have a thickness in the range of 3.05-5.47 nm such that a depletion layer forms in the second semiconductor layer 114 when the gate voltage $V_G$ exceeds 3 V. This makes it possible to minimize the increases in the voltage $V_{IN}$ across the insulating layer 110 and in the voltage $V_{CH}$ across the channel layer 100 and thereby substantially prevent increase in the saturation current when the gate voltage $V_G$ is increased to and beyond 3 V. That is, the fourth embodiment provides the same advantages as the first embodiment. Thus, the present invention may be applied not only to IGBTs and power MOSFETs, but also to all types of devices having a MOS structure, such as MOSFETs used in LSIs.

The semiconductor device of the fourth embodiment is susceptible of alterations at least similar to those that can be made to the semiconductor device of the first embodiment. Further, features of the semiconductor devices of embodiments described above may be combined where appropriate.

In the above-described semiconductor device of the present invention, a depletion layer does not form in the semiconductor layer on the insulating layer when the gate voltage of the semiconductor device is lower than that at which the semiconductor device exhibits the allowable minimum saturation current, and a depletion layer forms and extends in the semiconductor layer when the gate voltage is higher than that at which the semiconductor device exhibits a predetermined saturation current. This makes it possible to reduce the rate of change of the saturation current with respect to changes in the gate voltage without any problem.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-207393, filed on Sep. 20, 2012 including specification, claims, drawings and summary, on which the Convention priority of the present application is based, are incorporated herein by reference in its entirety.

What is claimed is:

1. A semiconductor device comprising:
a channel layer formed on a substrate;
an insulating layer formed in direct contact with said channel layer;
an impurity-doped first semiconductor layer formed on an opposite side of said insulating layer from said channel layer and in direct contact with said insulating layer;
an impurity-doped second semiconductor layer formed on an opposite side of said first semiconductor layer from said insulating layer and in direct contact with said first semiconductor layer; and
a gate electrode formed on an opposite side of said second semiconductor layer from said first semiconductor layer and in direct contact with second semiconductor layer,
wherein a quotient of an impurity density of said first semiconductor layer divided by a relative permittivity of said first semiconductor layer is greater than a quotient of an impurity density of said second semiconductor layer divided by a relative permittivity of said second semiconductor layer.

2. The semiconductor device according to claim 1, wherein when a gate voltage is lower than a transition voltage at which a depletion layer forms to occupy entire said first semiconductor layer, a depletion layer forms in only a portion of said first semiconductor layer and a depletion layer does not form in said second semiconductor layer,
when a gate voltage is higher than the transition voltage, a depletion layer forms to occupy entire said first semiconductor layer and at least a portion of said second semiconductor layer.

3. The semiconductor device according to claim 2, wherein said impurity density of said second semiconductor layer is one-tenth or less that of said first semiconductor layer.

4. The semiconductor device according to claim 1, further comprising a barrier layer formed between said first semiconductor layer and said second semiconductor layer, said barrier layer have a lower impurity diffusion coefficient than said second semiconductor layer.

5. The semiconductor device according to claim 1, further comprising a emitter layer formed on said channel layer, wherein said insulating layer, said first semiconductor layer, said second semiconductor layer, and said gate electrode form a trench gate which penetrates through said channel layer and said emitter layer to said substrate, and wherein a portion of said insulating layer which is in contact with said emitter layer is thicker than a portion of said insulating layer in contact with said channel layer.

6. The semiconductor device according to claim 1, further comprising a emitter layer formed on said channel layer, wherein said insulating layer, said first semiconductor layer, said second semiconductor layer, and said gate electrode form a trench gate which penetrates through said channel layer and said emitter layer to said substrate, and wherein a portion of said first semiconductor layer which penetrates through said emitter layer has a higher impurity density than a portion of said first semiconductor layer which penetrates through said channel layer.

7. The semiconductor device according to claim 1, wherein a thickness of said first semiconductor layer is selected to satisfy the following inequalities:

$$L_{GA} \geq \frac{-(q/\varepsilon_{IN} \cdot t_{IN}) + \sqrt{(q/\varepsilon_{IN} \cdot t_{IN})^2 + 4q(1/\varepsilon_{CH}/N_{CH} + 1/\varepsilon_{GA}/N_{GA}) \cdot V_{GM}}}{2qN_{GA}(1/\varepsilon_{CH}/N_{CH} + 1/\varepsilon_{GA}/N_{GA})}$$

$$L_{GA} \leq \frac{-(q/\varepsilon_{IN} \cdot t_{IN}) + \sqrt{(q/\varepsilon_{IN} \cdot t_{IN})^2 + 4q/\varepsilon_{GA}/N_{GA} \cdot V_{GM}}}{2q/\varepsilon_{GA}}$$

wherein $L_{GA}$ =thickness of said first semiconductor layer
$\varepsilon_{IN}$ =relative permittivity of a gate insulating film
$\varepsilon_{CH}$ =relative permittivity of said channel layer
$\varepsilon_{GA}$ =relative permittivity of said first semiconductor layer $t_{IN}$ =thickness of said gate insulating film
$N_{CH}$ =impurity density of a depletion layer in said channel layer $N_{GA}$ =impurity density of said first semiconductor layer $V_{GM}$ =gate voltage at which a depletion layer forms to occupy entire said first semiconductor layer.

8. The semiconductor device according to claim 1, further comprising a low resistance layer which has a lower resistance than said second semiconductor layer and formed between said second semiconductor layer and said gate electrode.

9. The semiconductor device according to claim 1, wherein said substrate is formed of a wide bandgap semiconductor.

10. The semiconductor device according to claim 9, wherein said wide bandgap semiconductor is silicon carbide, gallium nitride-based material, or diamond.

11. The semiconductor device according to claim 1, wherein said gate electrode has lower resistance than said second semiconductor layer.

12. The semiconductor device according to claim 1, wherein said gate electrode is formed of a high melting point metal.

* * * * *